United States Patent
Kato et al.

(10) Patent No.: US 7,036,212 B2
(45) Date of Patent: May 2, 2006

(54) APPARATUS FOR PERFORMING OPERATION ON CIRCUIT SUBSTRATE

(75) Inventors: Mitsuaki Kato, Anjo (JP); Sumio Kadomatsu, Okazaki (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 557 days.

(21) Appl. No.: 10/318,238

(22) Filed: Dec. 13, 2002

(65) Prior Publication Data

US 2003/0117130 A1    Jun. 26, 2003

(30) Foreign Application Priority Data

Dec. 20, 2001    (JP)    ............................. 2001-388119

(51) Int. Cl.
*H05K 3/30*    (2006.01)
(52) U.S. Cl. ............................. 29/740; 29/708; 29/709; 29/721; 29/759; 29/834; 414/735; 414/281; 901/40
(58) Field of Classification Search .......... 29/739–743, 29/759, DIG. 44, 703, 830–834; 414/735, 414/281; 901/9, 40–47
See application file for complete search history.

(56) References Cited

U.S. PATENT DOCUMENTS 4,598,456 A * 7/1986 McConnell ............. 29/407.04
6,256,870 B1 * 7/2001 Asai et al. ............. 29/740
6,629,364 B1 * 10/2003 Asai et al. ............. 29/832
6,944,943 B1 * 9/2005 Cho et al. ............. 29/740
2003/0117130 A1 * 6/2003 Kato et al. ............. 324/158.1

FOREIGN PATENT DOCUMENTS

| JP | A 5-116037 | 5/1993 |
| JP | A 6-342998 | 12/1994 |
| JP | A 10-236781 | 9/1998 |
| JP | A 2000-185820 | 7/2000 |
| JP | A 2000-320794 | 11/2000 |

* cited by examiner

Primary Examiner—Minh Trinh
(74) Attorney, Agent, or Firm—Olff & Berridge, PLC

(57) ABSTRACT

An apparatus for performing an operation on a circuit substrate, the apparatus including a plurality of operating devices which are provided in a space that is closed and opened by a safety cover and one of which performs the operation on the circuit substrate, a safety-cover switch which is switchable to an ON state thereof corresponding to a closed state of the safety cover, and to an OFF state thereof corresponding to an opened state of the safety cover, a maintenance-related control device which keeps, in a maintenance mode, at least one of the operating devices to a state thereof in which the one operating device is operable, and a maintenance-mode setting switch which cooperates with the safety-cover switch to provide a parallel circuit, and which is selectively operable to an ON state thereof in which the maintenance-mode setting switch allows setting of the maintenance mode, and to an OFF state thereof in which the maintenance-mode setting switch does not allow the setting of the maintenance mode.

15 Claims, 13 Drawing Sheets

APPARATUS FOR PERFORMING OPERATION ON CIRCUIT SUBSTRATE

BACKGROUND OF THE INVENTION

1. Field of the Invention

The present invention relates to an apparatus for performing an operation on a circuit substrate such as a printed-wiring board, and particularly to the art of improving the safety of maintenance of the apparatus.

2. Discussion of Related Art

There are known various sorts of operation-on-circuit-substrate performing apparatuses such as a circuit-substrate machining apparatus that machines a circuit substrate, e.g., makes a hole in a circuit substrate; a screen printing apparatus that prints a high-viscosity fluid such as cream solder on a circuit substrate; a high-viscosity-fluid applying apparatus that applies a high-viscosity fluid, such as an adhesive, in the form of spots on a circuit substrate; an electric-component mounting apparatus that mounts an electric component (e.g., an electronic component) on a circuit substrate; and a circuit-substrate inspecting apparatus that inspects a circuit substrate before or after an electric component is mounted on the circuit substrate. Usually, an operation-on-circuit-substrate performing apparatus is provided with a safety cover for preventing a portion of a living person from entering an operation space or being injured because of the entrance.

However, the maintenance of the operation-on-circuit-substrate performing apparatus includes some operations each of which needs to operate at least one of a plurality of operating devices of the apparatus in a state in which the safety cover of the apparatus is opened. To this end, it is practiced to provide the apparatus with a bypass-key switch. More specifically described, when a special key called "bypass key" is inserted in a keyhole, a safety-cover switch is bypassed to close an electric circuit, so that at least one of the operating devices is made operable. This bypass key can be used by a very limited person or persons only, in a very limited case or cases only, and thus the maintenance of the apparatus is performed very carefully. Nonetheless, it is difficult to completely prevent all persons from being injured.

SUMMARY OF THE INVENTION

It is therefore an object of the present invention to improve the safety of maintenance of an operation-on-circuit-substrate performing apparatus. This object may be achieved according to any one of the following modes of the present invention in the form of an operation-on-circuit-substrate performing apparatus, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to the same mode.

(1) An apparatus for performing an operation on a circuit substrate, the apparatus comprising a plurality of operating devices which are provided in a space that is closed and opened by a safety cover and one of which performs the operation on the circuit substrate; a safety-cover switch which is switchable to an ON state thereof corresponding to a closed state of the safety cover, and to an OFF state thereof corresponding to an opened state of the safety cover; a maintenance-related control device which keeps, in a maintenance mode, at least one of the plurality of operating devices to a state thereof in which the at least one operating device is operable; and a maintenance-mode setting switch which cooperates with the safety-cover switch to provide a parallel circuit, and which is selectively operable to an ON state thereof in which the maintenance-mode setting switch allows setting of the maintenance mode, and to an OFF state thereof in which the maintenance-mode setting switch does not allow the setting of the maintenance mode.

In the present operation-on-circuit-substrate performing apparatus, the maintenance-related control device keeps, in the maintenance mode, at least one of the plurality of operating devices to the operable state thereof in which the one operating device is operable by an operator, and the operation of the maintenance-mode setting switch to the ON state thereof allows the setting of the maintenance mode. Therefore, the operator can operate the one operating device to achieve the maintenance of the apparatus, such as checking, inspection, measurement, or adjustment of the one operating device. The maintenance-mode setting switch is not a simple switch, unlike the above-described bypass-key switch that bypasses the safety-cover switch to close the electric circuit, but a switch that allows the setting of the maintenance mode. In the maintenance mode, the present apparatus is in a state differing from a state in which the safety cover is closed. Thus, the safety of maintenance of the present apparatus is improved.

(2) An apparatus according to the mode (1), wherein the maintenance-mode setting switch is provided in the space inside the safety cover, and is accessible when the safety cover is in the opened state thereof and is not accessible when the safety cover is in the closed state thereof.

In the present operation-on-circuit-substrate performing apparatus, the maintenance-mode setting switch is operable by the operator only in the state in which the safety cover is opened. Thus, the present apparatus is reliably prevented from being erroneously set in the maintenance mode, during an automatic operation of the apparatus.

(3) An apparatus according to the mode (1) or (2), wherein the maintenance-mode setting switch comprises a key, and a keyhole in which the key is insertable, and wherein when the key is inserted in the keyhole, subsequently the maintenance-mode setting switch is operated to a maintenance-mode position thereof and additionally the key is pulled out of the keyhole, then the maintenance-mode setting switch is operated to the ON state thereof and allows the setting of the maintenance mode and, when the key is inserted in the keyhole and subsequently the maintenance-mode setting switch is operated to the maintenance-mode position thereof, the maintenance-mode setting switch is kept to the OFF state thereof and does not allow the setting of the maintenance mode.

In the present operation-on-circuit-substrate performing apparatus, the setting of the maintenance mode is not allowed unless the key is inserted in the keyhole, subsequently the maintenance-mode setting switch is operated to the maintenance-mode position and additionally the key is pulled out of the keyhole. Therefore, in order to set the maintenance mode, the key must not be left in the keyhole. Thus, so long as the operator carries the key, other persons cannot reset the maintenance mode. This contributes to improving the safety.

(4) An apparatus according to any of the modes (1) to (3), wherein the maintenance-related control device comprises a command restricting portion which restricts, in the maintenance mode, a plurality of commands effective in an automatic-operation mode in which the apparatus is automatically operable, such that a total number of the restricted commands effective in the maintenance mode is smaller than a total number of the commands effective in the automatic-operation mode.

One or more commands that are effective in the automatic-operation mode but would be dangerous to use in the maintenance mode, are made ineffective in the maintenance mode. Thus, in case those commands are inputted in the maintenance mode, the present apparatus is not operated according to the commands, which contributes to improving the safety of maintenance of the apparatus.

(5) An apparatus according to the mode (4), wherein the command restricting portion comprises a command neglecting portion which neglects, in the maintenance mode, at least one of a start command to start the apparatus, and a remote-control command to automatically operate at least one of the plurality of operating devices.

(6) An apparatus according to the mode (4) or (5), wherein the command restricting portion comprises a command maintaining portion which maintains at least one of an inching command and an I/O check command, as at least one command effective in the maintenance mode.

The inching command is to command an inching operation of one or more appropriate operating devices; and the I/O check command is to command checking of inputting and outputting operations of an I/O (input/output) port of a computer. Since those commands are very important for the maintenance of the apparatus, it is desirable to keep those commands also in the maintenance mode. Since, in particular, the inching command is to command a low-speed operation of one or more appropriate operating devices, the safety is improved.

(7) An apparatus according to any of the modes (1) to (6), wherein the maintenance-related control device comprises a command modifying portion which modifies, in the maintenance mode, at least one of a plurality of normal-state commands effective in a normal state in which the safety cover is in the closed state thereof, into at least one modified command differing from the at least one normal-state command.

It is desirable that when the maintenance mode is set, at least a portion of the normal-state commands be automatically modified into one or more modified commands that are higher in safety or more useful for the maintenance of the apparatus.

(8) An apparatus according to the mode (7), wherein the command modifying portion comprises an operation-speed decreasing portion which operates at least one of the plurality of operating devices such that a speed of operation of the at least one operating device in the maintenance mode is lower than a speed of operation of the at least one operating device in the normal state.

Generally, the decreasing of speed of operation of an operating device leads to improving the safety of operation of the device. In addition, the operation speed is decreased in the maintenance mode only, and the higher speed is kept in the state in which the safety cover is closed. Thus, the lowering of efficiency of operation of the present operation-on-circuit-substrate performing apparatus can be prevented.

(9) An apparatus according to the mode (8), wherein the at least one operating device the speed of operation of which is decreased by the operation-speed decreasing portion comprises at least one of (a) a width changing device which changes a width of a circuit-substrate conveyor which conveys the circuit substrate and (b) a width-change preparing device which prepares a change of the width of the circuit-substrate conveyor.

The width-change preparing device is, e.g., a device that moves, before the width changing device starts the changing of the width of the circuit-substrate conveyor, by moving a movable rail of the conveyor, one or more devices that may possibly collide with the movable rail, to a retracted position.

(10) An apparatus according to the mode (8) or (9), wherein the plurality of operating devices comprises an electric-component supplying device which supplies at least one electric component; a circuit-substrate supporting device which supports the circuit substrate; and an electric-component mounting device which mounts the electric component supplied by the electric-component supplying device, on the circuit substrate supported by the circuit-substrate supporting device, and wherein the at least one operation device the speed of operation of which is decreased by the operation-speed decreasing portion comprises a moving device which moves at least one of the electric-component supplying device and the electric-component mounting device relative to the other of the electric-component supplying device and the electric-component mounting device.

According to this mode, the operation-on-circuit-substrate performing apparatus provides an electric-component mounting apparatus. Usually, the moving device needs to be operated at as high as possible a speed for the purpose of improving the efficiency of the operation of the mounting apparatus, and accordingly it is one of the most dangerous devices of the mounting apparatus. Thus, the decreasing of operation speed of the moving device is very effective to improving the safety.

The component mounting device of the electric-component mounting apparatus is, e.g., of (a) an X-Y robot type in which a component holder is linearly moved in each of two directions (called X-axis and Y-axis directions) that are parallel to a component-support surface of a circuit substrate held by a circuit-substrate holding device, or of (b) an index type in which a component holder is revolved around an axis line perpendicular to a component-support surface of a circuit substrate held by a circuit-substrate holding device. The component supplying device is, e.g., a device including one or more feeders each of which stores a plurality of electric components and feeds the components, one by one, to a component-supply portion thereof. In some cases, a plurality of feeders are mounted on a feeder-support table, such that respective component-support portions of the feeders are arranged in a direction. Many X-Y-robot-type component mounting devices are used with a stationary feeder-support table; and many index-type component mounting devices are used with a movable feeder-support table that is movable in the direction (called D-axis direction) in which the respective component-support portions of the feeders mounted thereon are arranged, so that an arbitrary one of the feeders may be positioned at a prescribed component-supply position. The component mounting device of the X-Y robot type or the index type may be adapted, for the maintenance of the apparatus, such that a suction nozzle can be stopped at a position near a component-supply portion of the component supplying device. In this case, if the operator designates a particular one of the feeders mounted on the feeder-support table, so that the component holder may pick up an electric component from the designated feeder, the moving device moves and stops the component holder to and at a position right above the designated feeder. In the case of the X-Y-robot-type component mounting device, the operation-speed decreasing portion decreases the speed of operation of the X-Y robot; and in the case of the index-type component mounting device, the operation-speed decreasing portion decreases the speed of operation of a drive device that moves the feeder-support table in the D-axis direction. Moreover, in such an index-type component mounting device in which a feeder-support table is moved to a retracted position, for the purpose of allowing the maintenance of other devices, the speed of operation of a drive device that moves the feeder-support table is decreased.

(11) An apparatus according to any of the modes (1) to (10), wherein the maintenance-related control device comprises a start-switch-lamp-flickering inhibiting portion which inhibits a start-switch lamp from flickering to inform an operator of a state in which a start switch is operable to produce a start command.

Since the flickering of the start-switch lamp is inhibited, the possibility of operation of the start switch is minimized. Thus, the safety of the apparatus is improved.

(12) An apparatus for performing an operation on a circuit substrate, the apparatus comprising a plurality of operating devices which are provided in a space that is closed and opened by a safety cover and one of which performs the operation on the circuit substrate; a circuit bypassing member which is attached, when the safety cover is in an opened state thereof, to the apparatus so as to establish a same electric state as an electric state when the safety cover is in a closed state thereof; and a maintenance-in-limited-area allowing device which allows, in a state in which the circuit bypassing member is attached to the apparatus, an access to a maintenance-needing area and does not allow an access to a dangerous area differing from the maintenance-needing area.

When the circuit bypassing member is attached to the present operation-on-circuit-substrate performing apparatus, the apparatus can be operated in the state in which the safety cover is opened. Thus, the maintenance of the apparatus can be easily done. However, the safety of the apparatus may be lowered. Hence, the present apparatus employs the maintenance-in-limited-area allowing device that allows access to the maintenance-needing area but does not allow access to the dangerous area. This leads to improving the safety of the apparatus.

(13) An apparatus according to the mode (12), wherein the maintenance-in-limited-area allowing device comprises a detecting device which detects, in the state in which the circuit bypassing member is attached to the apparatus, that a portion of a person has entered the dangerous area; and an in-emergency stopping device which stops an operation of the apparatus, in emergency when the detecting device detects that the portion of the person has entered the dangerous area.

Since the present operation-on-circuit-substrate performing apparatus includes, in addition to the circuit bypassing member, the entrance detecting device and the in-emergency stopping device, the apparatus is not stopped when a portion of the operator enters the maintenance-needing area, but is stopped in emergency when the operator's portion enters the dangerous area. Thus, the safety is improved. The entrance detecting device may be a detecting device that is widely used in a press machine. More specifically described, the detecting device includes a plurality of light emitters and a plurality of light receivers respectively opposed to the plurality of light emitters in a plane and, when any of respective light rays emitted by the respective light emitters is interrupted by the operator's portion and the corresponding light receiver fails to receive the light ray, produces an entrance-detection signal. Alternatively, the entrance detecting device may be one that detects, on a no-contact basis, that an object has entered a certain three-dimensional space, and produces an entrance-detection signal.

(14) An apparatus according to the mode (12), wherein the maintenance-in-limited-area allowing device comprises a partial cover which allows, in the state in which the circuit bypassing member is attached to the apparatus, a portion of a person to enter the maintenance-needing area and prevents the portion of the person from entering the dangerous area.

The partial cover is as advantageous as the above-described entrance detecting device and in-emergency stopping device. However, in many cases, the latter devices are more easily disposed.

(15) An apparatus according to any of the modes (1) to (11), (13), and (14), further comprising a circuit bypassing member which is attached, when the safety cover is in the opened state thereof, to the apparatus so as to establish a same electric state as an electric state when the safety door is in the closed state thereof; and a maintenance-in-limited-area allowing device which allows, in a state in which the circuit bypassing member is attached to the apparatus, an access to a maintenance-needing area and does not allow an access to a dangerous area differing from the maintenance-needing area.

The present apparatus is as advantageous as the apparatus according to the mode (12).

(16) An apparatus according to any of the modes (1) to (15), further comprising a prescribed-state keeping device which stops, when the safety cover is in the closed state thereof, at least one of the plurality of operating devices so that the at least one operating device takes a prescribed state thereof, and keeps the at least one operating device to the prescribed state thereof even when the safety cover is opened.

The prescribed-state keeping device can keep at least one operating device to a prescribed state thereof. Therefore, the operator can open the safety cover and observe the operating device kept in that state. For example, in the case where the prescribed-state keeping device keeps the suction nozzle of the electric-component mounting apparatus to a prescribed state thereof in which the nozzle is stopped at a position near the component-supply portion of the component supplying device, the operator need not dangerously see, during the operation of the apparatus, into the inner space to check whether a relative position of the nozzle to the supply portion is correct. Thus, the safety is improved.

DETAILED DESCRIPTION OF THE PREFERRED EMBODIMENTS

Hereinafter, there will be described in detail, by reference to the drawings, an embodiment of the present invention that is applied to an electronic-component mounting apparatus as a sort of operation-on-circuit-substrate performing apparatus. Electronic components are a sort of electric components and accordingly the electronic-component mounting apparatus is a sort of electric-component mounting apparatus.

Figure 1:
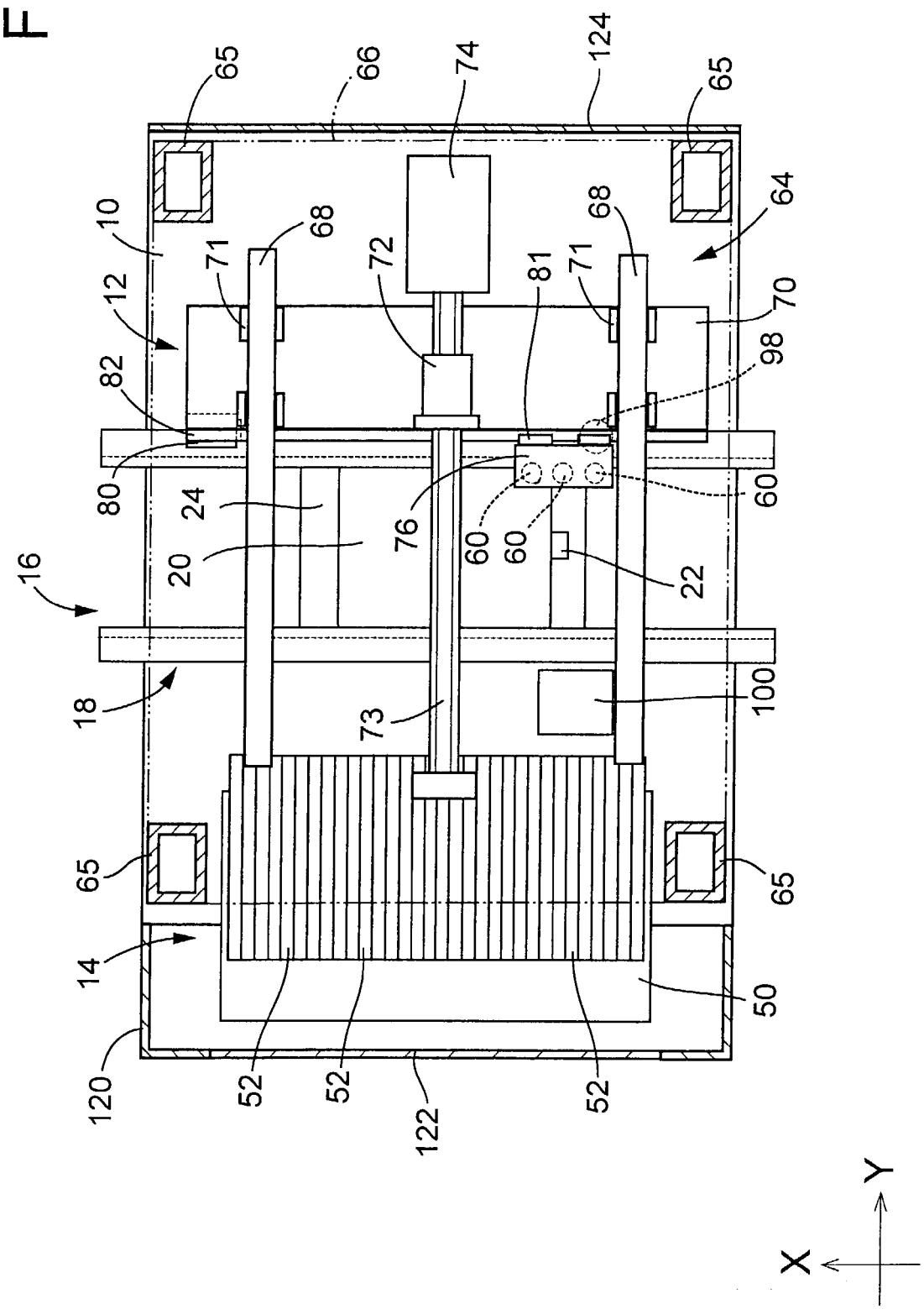
FIG. 1 is a schematic plan view of an electronic-component mounting apparatus as a sort of operation-on-circuit-substrate performing apparatus as an embodiment of the present invention.

In FIG. 1, reference numeral 10 designates a base of the present electronic-component mounting apparatus. On the base 10, there are provided a component mounting device 12, a component supplying device 14, and a printed-wiring-board conveying device 16. The printed-wiring-board conveying device 16 includes a printed-wiring-board conveyor 18 as a sort of circuit-substrate conveyor that extends in an X-axis direction indicated at an arrow in FIG. 1 and conveys a printed wiring board 20 as a sort of circuit substrate. The conveying device 16 additionally includes a stopping device 22 that stops and positions the printed-wiring board 20 conveyed by the conveyor 18, at a component-mount station as a prescribed operation station; and a printed-wiring-board holding device 24 holds the printed-wiring board 20 positioned by the stopping device 22.

Figure 2:
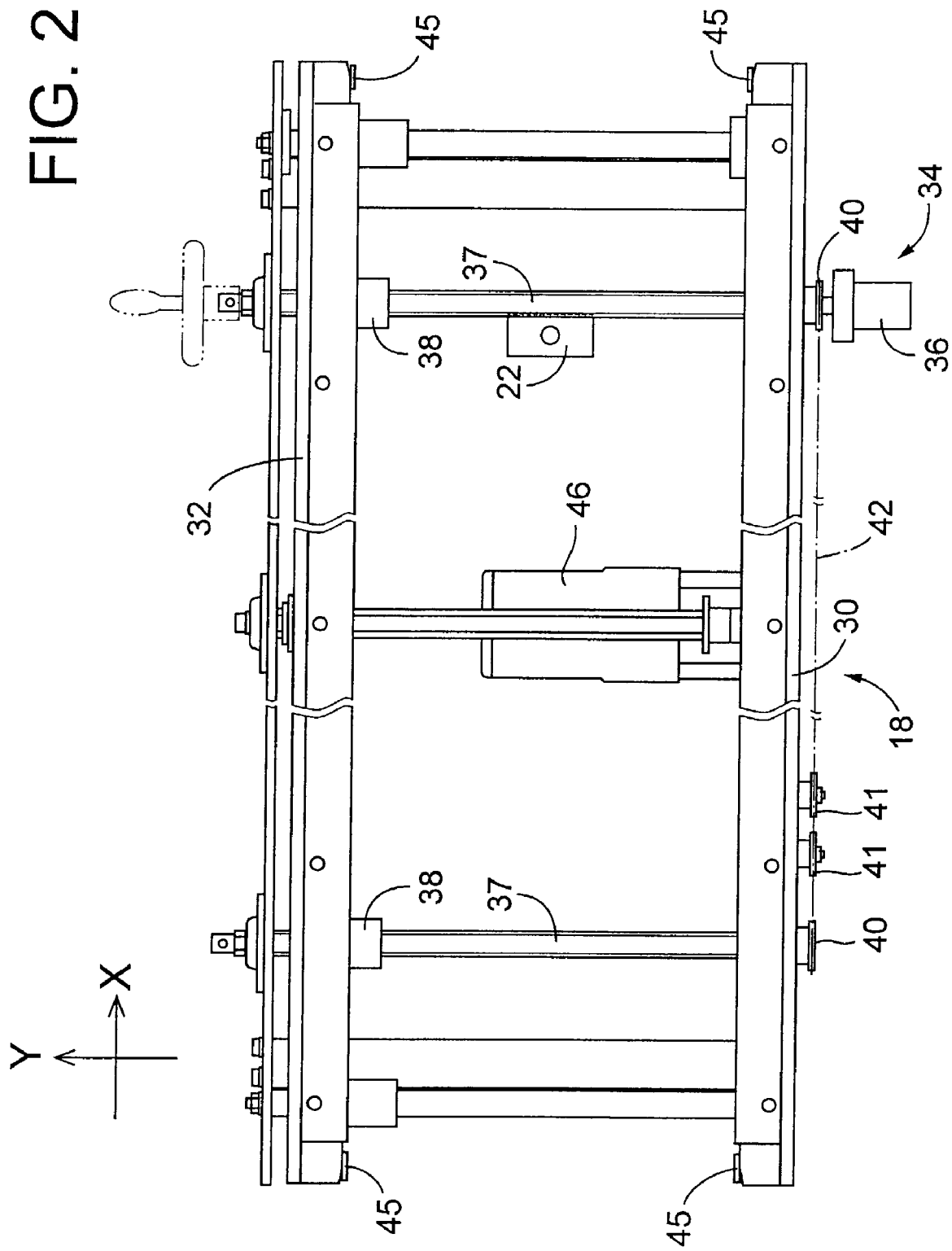
FIG. 2 is a schematic plan view of a circuit-substrate holding device of the mounting apparatus.

As shown in FIG. 2, the printed-wiring-board conveyor 18 includes a pair of guide rails 30, 32 that extend parallel to each other. In the present embodiment, one 30 of the two guide rails 30, 32 is a fixed guide rail; and the other guide rail 32 is a movable guide rail. The fixed and movable guide rails 30, 32 are parallel to the X-axis direction and are horizontal; the fixed guide rail 30 is not movable relative to the base 10; and the movable guide rail 32 is movable toward, and away from, the fixed guide rail 30, in a Y-axis direction perpendicular to the X-axis direction in a horizontal plane. A distance of the movable guide rail 32 from the fixed guide rail 30 in the Y-axis direction (i.e., a board-convey width) can be changed by a width changing device 34. The width changing device 34 includes a width changing motor 36 as a drive source; two feed screws 37 that are rotatably supported by the two guide rails 30, 32; two nuts 38 that are fixed to the movable member 32 and are threadedly engaged with the two feed screws 37, respectively; and a rotation transmitting device including two pairs of sprockets 40, 41 rotatably supported by the fixed guide rail 30, and a chain 42 wound on the sprockets 40, 41.

A plurality of pulleys 45 are rotatably supported by each of respective surfaces of the two guide rails 30, 32 that are opposed to each other, and an endless belt (not shown) is wound on those pulleys 45. When a board conveying motor 46 as a drive source of a belt circulating device is started, the pair of conveyor belts are circulated in synchronism with each other.

The component supplying device 14 is provided outside the printed-wiring-board conveyor 18. As shown in FIG. 1, the supplying device 14 includes a feeder-support table 50, and a number of electronic-component feeders 52 (hereinafter, abbreviated to the "feeders" 52) that are arranged in the X-axis direction on the table 50. The supplying device 14 is not movable relative to the base 10. Each of the feeders 52 stores electronic components 54 (FIG. 3) of one sort, and feeds the electronic components, one by one, to a component-supply portion thereof. Each feeder 52 may be one that feeds a tape carrying a plurality of electronic components at regular intervals of distance, so that those electronic components are fed, one by one, to a component-supply portion of the feeder; or one that stores electronic components in a casing, arranges those electronic components into a single array by utilizing air flow, inclination, or vibration, or an appropriate combination thereof, and feeds the components, one by one, to a component-supply portion of the feeder.

The component mounting device 12 includes three component holding heads 60 that are linearly movable in each of the X-axis direction and the Y-axis direction so as to receive respective electronic components 54 from appropriate feeders 52, at respective component receiving positions corresponding to the respective component-supply portions of the feeders 52, and transfer the received electronic components 54, and mount the components 54 on the printed-wiring board 20 held at the component mounting station. To this end, the mounting device 12 further includes an X-Y robot 64 as an X-Y moving device. The X-Y robot 64 is supported by an upper frame 66 that is provided above the base 10 and is supported by columns 65. In FIG. 1, the upper frame 66 is not shown for easier understanding purposes only, but a position thereof is indicated at two-dot chain line. A pair of guide rails 68 are fixed to the upper frame 66, such that the two guide rails 68 are parallel to each other and are horizontal; and a Y-axis slide 70 fits via guide blocks 71 on the guide rails 68. A nut 72 fixed to the Y-axis slide 70 is threadedly engaged with a feed screw 73 that extends parallel to the Y-axis direction. When the feed screw 73 is rotated by a Y-axis motor 74, the Y-axis slide 70 is moved in the horizontal, Y-axis direction. Thus, the nut 72, the feed screw 73, and the Y-axis motor 74 cooperate with each other to provide a Y-axis-slide drive device that moves the Y-axis slide 70; and the guide rails 68 and the guide blocks 71 cooperate with each other to provide a guide device that guides the movement of the Y-axis slide 70.

The Y-axis slide 70 supports an X-axis slide 76 such that the X-axis slide 76 is movable in the X-axis direction perpendicular to the Y-axis direction. The Y-axis slide 70 has a vertical surface to which a feed screw (not shown) is fixed so as to extend in the X-axis direction; and the X-axis slide 76 fits via a nut (not shown) on the feed screw. When the feed screw is rotated by an X-axis motor 80 (FIG. 1), the X-axis slide 76 is moved in the X-axis direction while being guided by a guide block 81 and a guide rail 82. The feed screw, the nut, and the X-axis motor 80 cooperate with each other to provide an X-axis-slide drive device that moves the X-axis slide 76; and the guide block 81 and the guide rail 82 cooperate with each other to provide a guide device that guides the movement of the X-axis slide 76. The X-Y robot 64 includes the Y-axis slide 70, the Y-axis-slide drive device, the X-axis slide 76, the X-axis-slide drive device, and the respective guide devices for guiding the respective movements of the Y-axis and X-axis slides 70, 76. The X-axis slide 76 supports the three component holding heads 60 such that the three heads 60 are arranged in the X-axis direction. The X-Y robot 64 can move each of the heads 60 to an arbitrary position in the horizontal plane. Each head 60 includes a suction nozzle 83 that applies suction to an electronic component 54 and thereby holds the component; and a nozzle holder 84 that holds the suction nozzle 83.

Figure 3:
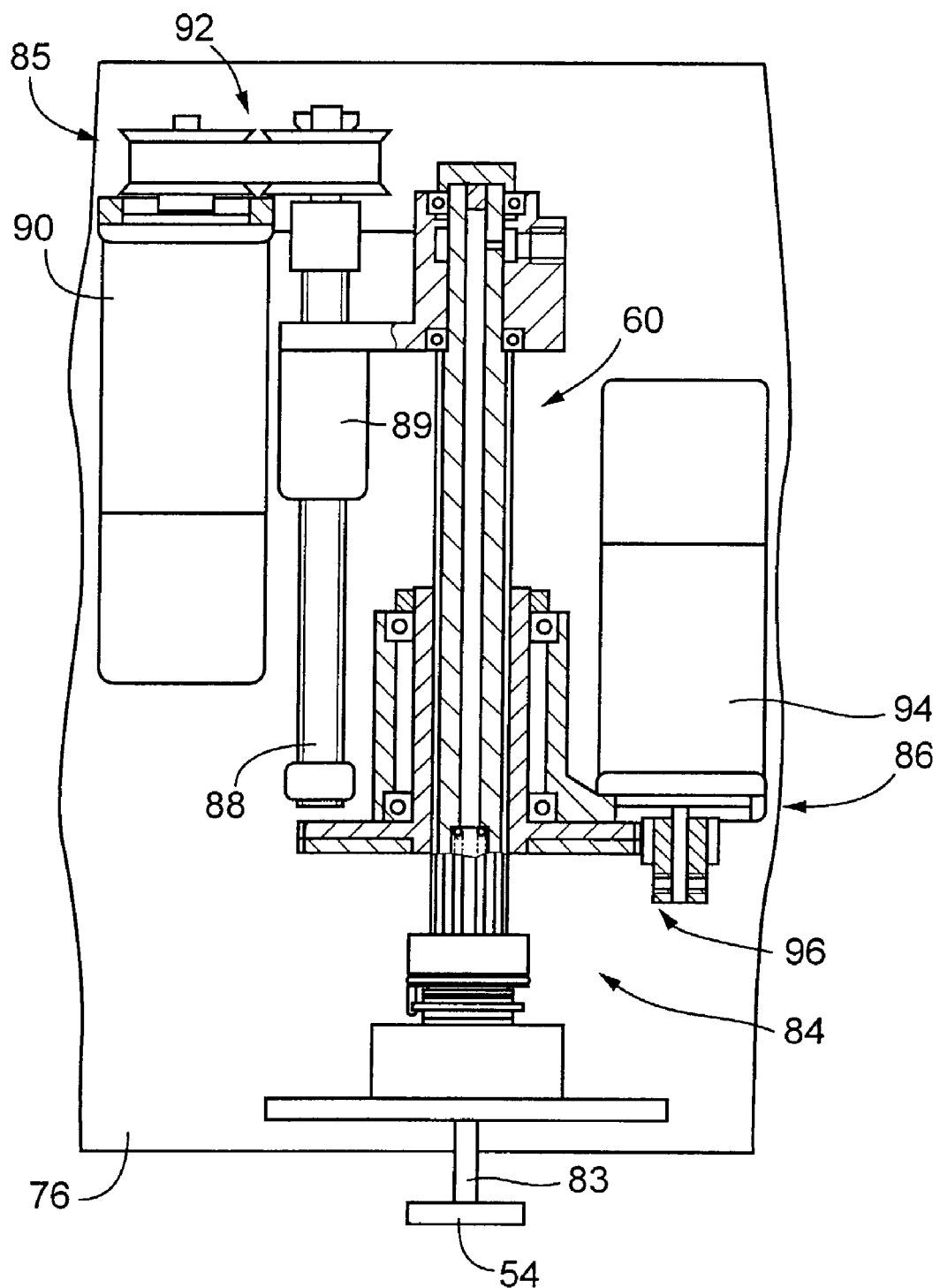
FIG. 3 is a partly cross-sectioned, front elevation view of a component mounting device of the mounting apparatus.

As shown in FIG. 3, a vertical side surface of the X-axis slide 76 supports the three component holding heads 60, such that each of the heads 60 is vertically movable and is rotatable about a vertical axis line. The X-axis slide 76 additionally supports an elevating and lowering device 85 that elevates and lowers the each head 60; and a rotating device 86 that rotates the each head 60 about the axis line. In the present embodiment, the vertical direction in which the each head 60 is moved is referred to as a Z-axis direction that is perpendicular to both the X-axis and Y-axis directions. The elevating and lowering device 85 includes a feed screw 88 that is rotatably supported by the X-axis slide 76; a nut 89 that is threadedly engaged with the feed screw 88 and is integral with the nozzle holder 84 of the each head 60; a Z-axis motor 90 as a drive source; and a rotation transmitting device 92 that includes a drive pulley, a driven pulley, and a timing belt and transmits the rotation of the Z-axis motor 90 to the feed screw 88. In addition, the X-axis slide 76 supports a Z-axis sensor 93 (FIG. 7) that detects an upper-end position of the each head 60. The rotating device 86 includes a θ-axis motor 94; and a rotation transmitting device 96 that includes a drive wheel and a driven wheel and transmits the rotation of the θ-axis motor 94 to the each head 60.

Moreover, the X-axis slide 76 supports a CCD (charge-coupled device) camera 98 as a mark-image taking device that takes respective images of a plurality of fiducial marks provided on the printed-wiring board 20. An illuminating device 99 (FIG. 7) is provided for cooperation with the CCD camera 98 to illuminate an object and its background when the camera 98 takes the images of the marks. In addition, a line-scan camera 100 as an image taking device is provided at a position between the component supplying device 14 and the printed-wiring-board conveying device 16, on a board-convey route along which the component holding heads 60 transfer the respective electronic components 54 received from the respective feeders 52, to the printed wiring board 20 held by the printed-wiring-board holding device 24. The line-scan camera 100 takes respective images of the respective electronic components 54 held by the respective heads 60, from below the components 54. An illuminating device 102 (FIG. 7) is provided for cooperation with the line-scan camera 100. The line-scan camera 100 may be replaced with a CCD camera.

The entirety of the present electronic-component mounting apparatus is isolated from outside by a case 120, which has, at two positions distant from each other in the Y-axis direction, two safety covers 122, 124 each of which can be opened and closed. The main portion of the apparatus is provided in an inner space of the case 120 having the safety covers 122, 124. Thus, the case 120 and the safety covers 122, 124 cooperate with each other to prevent an operator from entering, during an operation of the present apparatus, the inner space in which the component mounting device 12, the component supplying device 14, and the printed-wiring-board conveying device 16 are provided, that is, entering a working space, or being injured because of the entrance.

The safety covers 122, 124 are provided with respective safety switches 130, 132 (FIGS. 7 and 8) that are contact-type sensors. Each of the safety covers 122, 124 has, on a side surface thereof that faces the inner space of the case 120, a male connector of a corresponding one of the safety switches 130, 132, and the case 120 (or the base 10) that holds the safety covers 122, 124 has a female connector that is connectable to the male connector. When each safety cover 122, 124 is closed, the male and female connectors are connected to each other, and the corresponding safety switch 130, 132 is switched to its On state. That is, when each safety cover 122, 124 is opened, the corresponding safety switch 130, 132 is switched to its OFF state; and when each safety cover 122, 124 is closed, the corresponding safety switch 130, 132 is switched to its ON state. Each safety switch 130, 132 may be provided by a non-contact-type sensor such as a reflection-type photoelectric sensor, a transmission-type photoelectric sensor, or a proximity switch.

Figure 7:
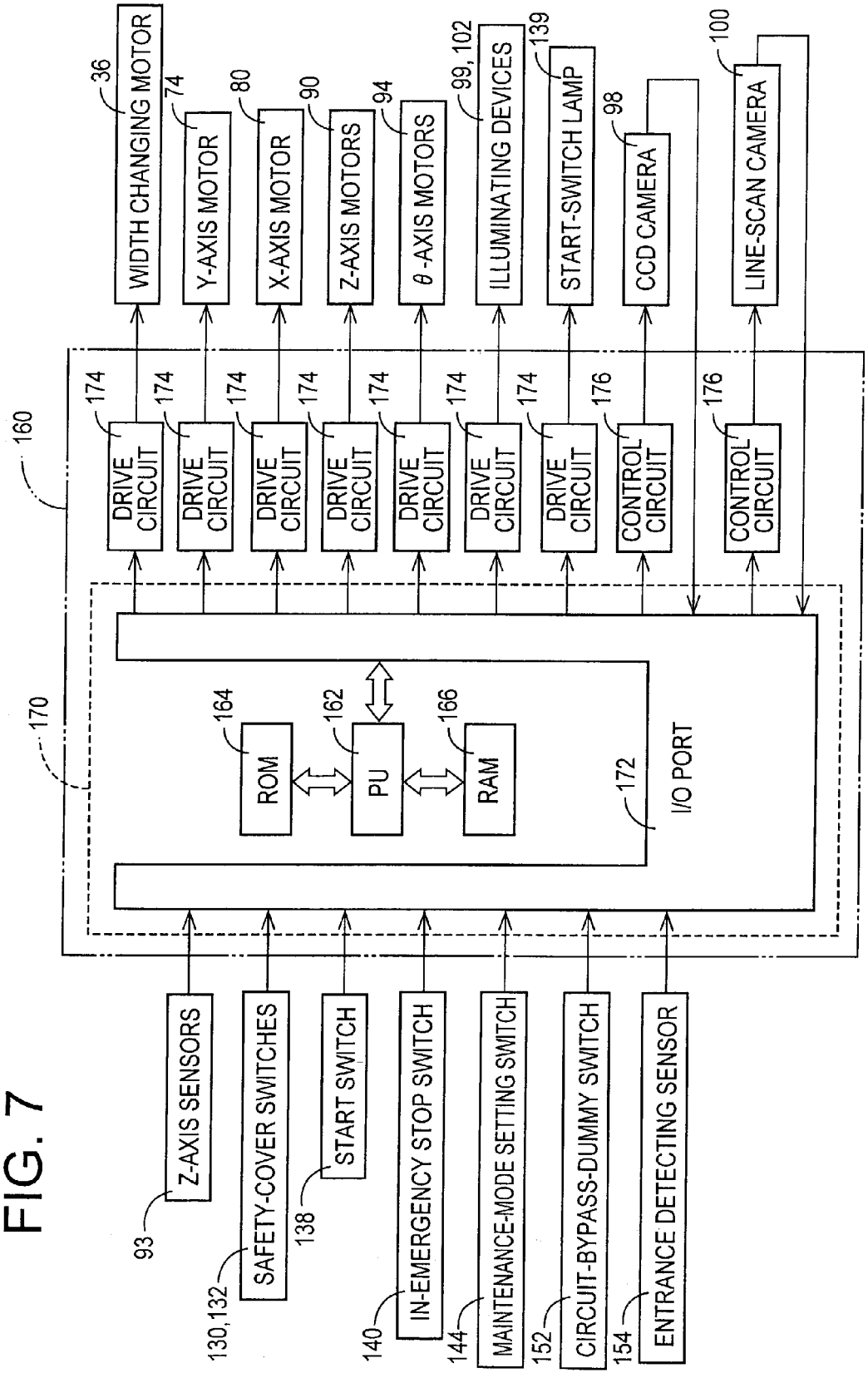
FIG. 7 is a diagrammatic view of a relevant portion of a control device of the mounting apparatus.
Figure 10:
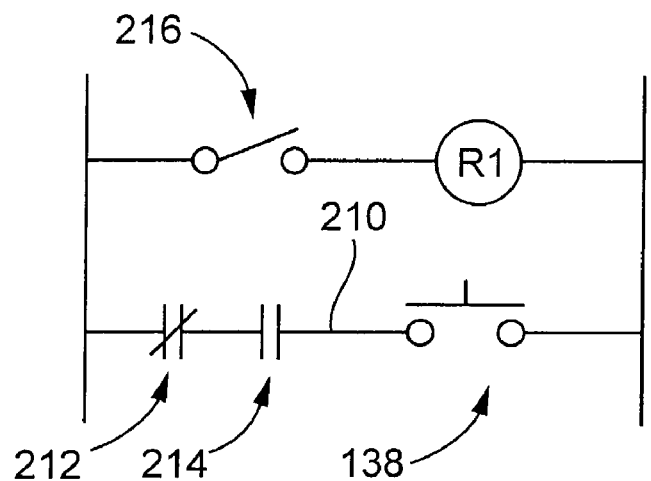
FIG. 10 is a view showing a sequence circuit that is related to a start command to start an operation of the mounting apparatus.

The present electronic-component mounting apparatus has a start switch 138 (FIGS. 7 and 10). When one or more starting conditions are satisfied, a start-switch lamp 139 provided on an operator's panel of the present apparatus is flickered to inform the operator of a fact that the starting conditions have been satisfied. When the start switch (i.e., push button) 138 is operated (i.e., pushed) by the operator in response to the flickering of the lamp 139, the start switch 138 is switched to its ON state to start the operation of the present apparatus.

Figure 8:
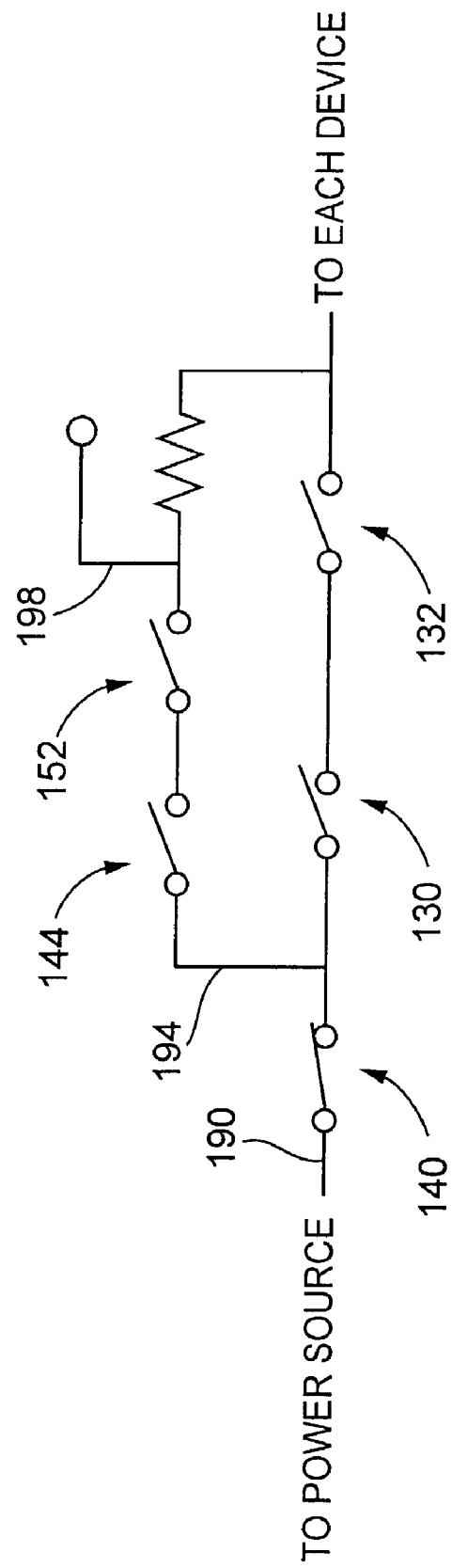
FIG. 8 is a view showing an electric circuit connecting between a power source of the mounting apparatus and the above-indicated circuit-substrate holding and component mounting devices of the same.

In addition, the present apparatus has an in-emergency stop switch 140 (FIGS. 7 and 8). When the in-emergency stop switch 140 is pushed by the operator, the stop switch 140 is switched to its OFF state; and when the stop switch 140 is released, the switch 140 is switched to its ON state. When the operator must stop the operation of the present apparatus in emergency, he or she pushes the switch 140.

In the present embodiment, each of the component mounting heads 60 provides an operating device that performs an operation on the printed wiring board 20 as the circuit substrate; and the component mounting device 12, the component supplying device 14, the width changing device 34 of the printed-wiring-board conveying device 16, the X-Y robot 64, the elevating and lowering device 85, and the rotating device 86 provide respective operating devices. The electronic-component mounting apparatus including the operating devices provides the operation-on-circuit-substrate performing apparatus to which the present invention is applied.

The maintenance of the present electronic-component mounting apparatus is carried out during or after an electric-circuit assembling operation, and before the component holding heads 60 start respective component mounting operations. Otherwise, during the component mounting operations of the holding heads 60, the maintenance may be carried out as countermeasures against the malfunction of the apparatus. For example, the maintenance of the present apparatus includes the following operations:

(a) Regarding the Y-axis motor 74 and the X-axis motor 80, respective output members of those motors 74, 80 are fixedly connected to respective suitable members;

(b) Regarding the Z-axis sensors 93 that detect the respective Z-axis-direction positions of the respective component holding heads 60, those sensors 93 are adjusted;

(c) Regarding the X-Y robot 64 and the printed-wiring-board conveyor 18, a degree of parallelism of the robot 64 relative to the conveyor 18 is measured using a dial gauge, and then a state in which the robot 64 and the conveyor 18 are assembled with each other is adjusted;

(d) Regarding the guide rails 30, 32 of the printed-wiring-board conveyor 18, a degree of flatness of those rails 30, 32 is measured using a dial gauge, and the degree of flatness is improved, as needed;

(e) Regarding the CCD camera 98 and the line-scan camera 100, those cameras 98, 100 are used to take images, and respective focal distances of the cameras are adjusted;

(f) Regarding the line-scan camera 100, characteristic values of the camera 100 are measured; and (g) Regarding the component holding heads 60 and the electronic-component feeders 52, respective relative positions of those heads 60 to the feeders 52 when the heads pick up electronic components from the feeders are adjusted.

Figure 4:
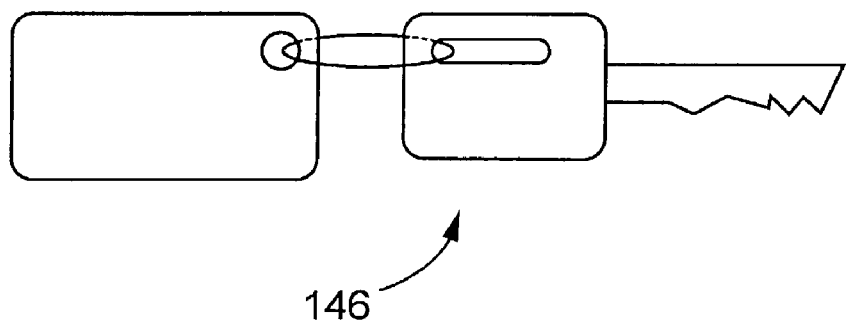
FIG. 4 is a front elevation view of a key for use in operating a maintenance-mode setting switch of the mounting apparatus.
Figure 5:
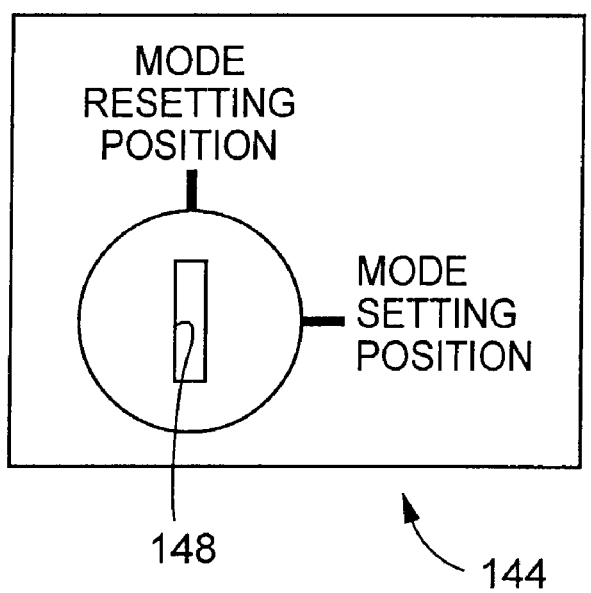
FIG. 5 is a front elevation view of the maintenance-mode setting switch.

The maintenance of the present apparatus is carried out in the state in which a maintenance mode is set. To this end, a maintenance-mode setting switch 144, shown in FIG. 5, is provided, in the inner space inside the safety cover 122, at a position where the operator can make access in the state in which the safety cover 122 is opened, but cannot make access in the state in which the safety cover 122 is closed. The maintenance-mode setting switch 144 includes a key 146 shown in FIG. 4, and a keyhole 148 as an operable portion in which the key 146 is insertable. The setting of the maintenance mode is allowed when first the operator inserts the key 146 into the keyhole 148 in a state in which the keyhole 148 is positioned at a maintenance-mode resetting position, subsequently turns the key 146 to a maintenance-mode setting position, and then pulls the key 146 out of the keyhole 148. This state is an ON state of the maintenance-mode setting switch 144. After the maintenance mode is thus set, if the operator carries the key 146 with himself, other persons can be assuredly prevented from operating the maintenance-mode setting switch 144. On the other hand, if the operator inserts the key 146 in the keyhole 148 in the state in which the keyhole 148 is positioned at the maintenance-mode setting position, the maintenance mode is reset.

Figure 6:
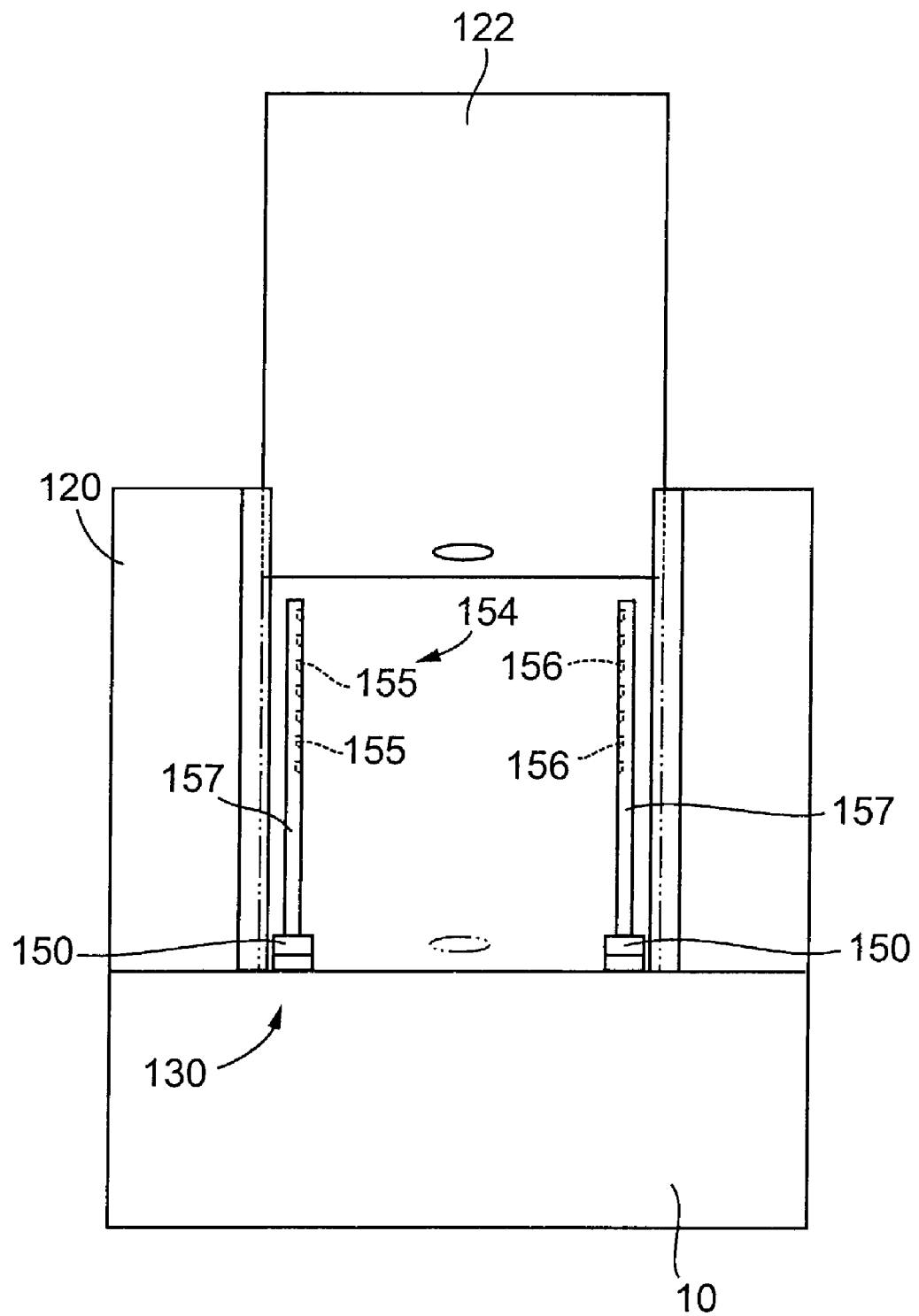
FIG. 6 is a front elevation view of a circuit bypassing dummy and an entrance detecting device of the mounting apparatus.

The maintenance mode is set when the safety cover 122 is opened and then the maintenance-mode setting switch 144 is switched to the ON state, as described, and additionally a circuit-bypass dummy 150 as a male connector is attached, as shown in FIG. 6, to the female connector of the safety-cover switch 130. The circuit-bypass dummy 150 is used to produce the same electric state as the electric state when the safety cover 122 is closed. If the circuit-bypass dummy 150 is attached to the electric-component mounting apparatus, a circuit-bypass-dummy switch 152 (FIGS. 7 and 8) is switched to an ON state. An entrance detector 154 is integral with the circuit-bypass dummy 150. In the present embodiment, the entrance detector 154 is provided by a transmission-type photoelectric sensor including light emitters 155 and light receivers 156, and the group of light emitters 155 and the group of light receivers 156 are supported by two support members, respectively, such that the light emitters 155 and the light receivers 156 are opposed to each other. The entrance detector 154 detects that an object has entered a dangerous area other than a maintenance needing area. Thus, the operator is allowed to carry out, in the maintenance needing area, various operations needed for the maintenance, but is not allowed to enter the dangerous area. If a portion of the operator enters the dangerous area, the entrance detector 154 detects the entrance of the operator's portion, and the in-emergency switch 140 is automatically switched to an OFF state, so that the current operation of the electric-component mounting apparatus is automatically stopped in emergency. In the present embodiment, the in-emergency switch 140 is not only manually operable by the operator, but also automatically switchable. However, it is possible to employ an automatically operable in-emergency switch that cooperates with an in-emergency switch manually operable by an operator, or the circuit-bypass-dummy switch 152, to provide a series circuit.

The present electronic-component mounting apparatus is operated under control of a control device 160 shown in FIG. 7. The control device 160 is essentially provided by a computer 170 including a PU (processing unit) 162, a ROM (read only memory) 164, a RAM (random access memory) 166, and a bus for coupling those elements with each other. The bus is coupled to an I/O (input-and-output) port 172. To the I/O port 172, various sensors including the Z-axis sensors 93 and the entrance detector 154; the safety-cover switches 130, 132; the start switch 138; the in-emergency stop switch 140; the maintenance-mode setting switch 144; and the circuit-bypass-dummy switch 152 are connected. The I/O port 172 is also connected via respective drive circuits 174 to the width changing motor 36, the Y-axis motor 74, the X-axis motor 80, the Z-axis motors 90, the θ-axis motors 94, the illuminating devices 99, 102, and the start-switch lamp 139. Each of the Y-axis motor 74, the X-axis motor 80, the Z-axis motors 90, and the θ-axis motors 94 is a servomotor as a sort of electric motor that functions as a drive source and is accurately controllable with respect to its rotation amount or angle. In addition, the I/O port 172 is connected via respective control circuits to the CCD camera 98 and the line-scan camera 100. The ROM 164 stores not only a control routine used when a plurality of electronic components 54 are mounted on the printed-wiring board 18, but also other control programs used when other operations of the present apparatus are controlled. The RAM 166 stores a control program used when the component holding heads 60 are moved according to the sorts of electric components 54 to be mounted on the board 18, the places on the board 18 where the components 54 are to be mounted, and the order of mounting of the components 54. The RAM 166 additionally stores a maintenance-mode setting program, described later.

FIG. 8 shows an electric circuit 190 that connects between each of the individual devices of the electric-component mounting apparatus, and a power source. The electric circuit 190 includes the above-described in-emergency stop switch 140 and safety-cover switches 130, 132 that cooperate with each other to provide a series circuit. When all of those switches 130, 132, 140 are switched to their ON states, the electric circuit 190 is closed, and the present apparatus is connected to the power source. The in-emergency switch 140 is a normally closed switch and, if the switch 140 is operated manually by the operator, or operated automatically, the switch 140 is switched to its OFF (i.e., opened) state. Meanwhile, when the safety covers 122, 124 are opened, the safety-cover switches 130, 132 are switched to their OFF states. Therefore, if at least one of conditions including a first condition that the in-emergency switch 140 is operated and a second condition that at least one of the two safety covers 122, 124 is opened is satisfied, the electric circuit 190 is not closed, and the present apparatus is not supplied with electric power. However, the electric circuit 190 employs a bypass circuit 194 including the maintenance-mode setting switch 144 and the circuit-bypass-dummy switch 152. When the maintenance of the apparatus is carried out, the safety cover 122 is opened. Therefore, if the operator operates the maintenance-mode setting switch 144 to its ON (i.e., closed) state and additionally attaches the circuit-bypass dummy 150 to switch the circuit-bypass-dummy 152 to its ON state, then the bypass circuit 194 connects the present apparatus to the power source, thereby setting the maintenance mode. When the bypass circuit 194 is closed and is connected via a terminal 198 to the computer 198, the computer 198 can detect that the electric current is supplied from the power source to each device via the bypass circuit 194, unlike a normal state in which the electric current is supplied via the main circuit including the safety-cover switches 130, 132.

Figure 9:
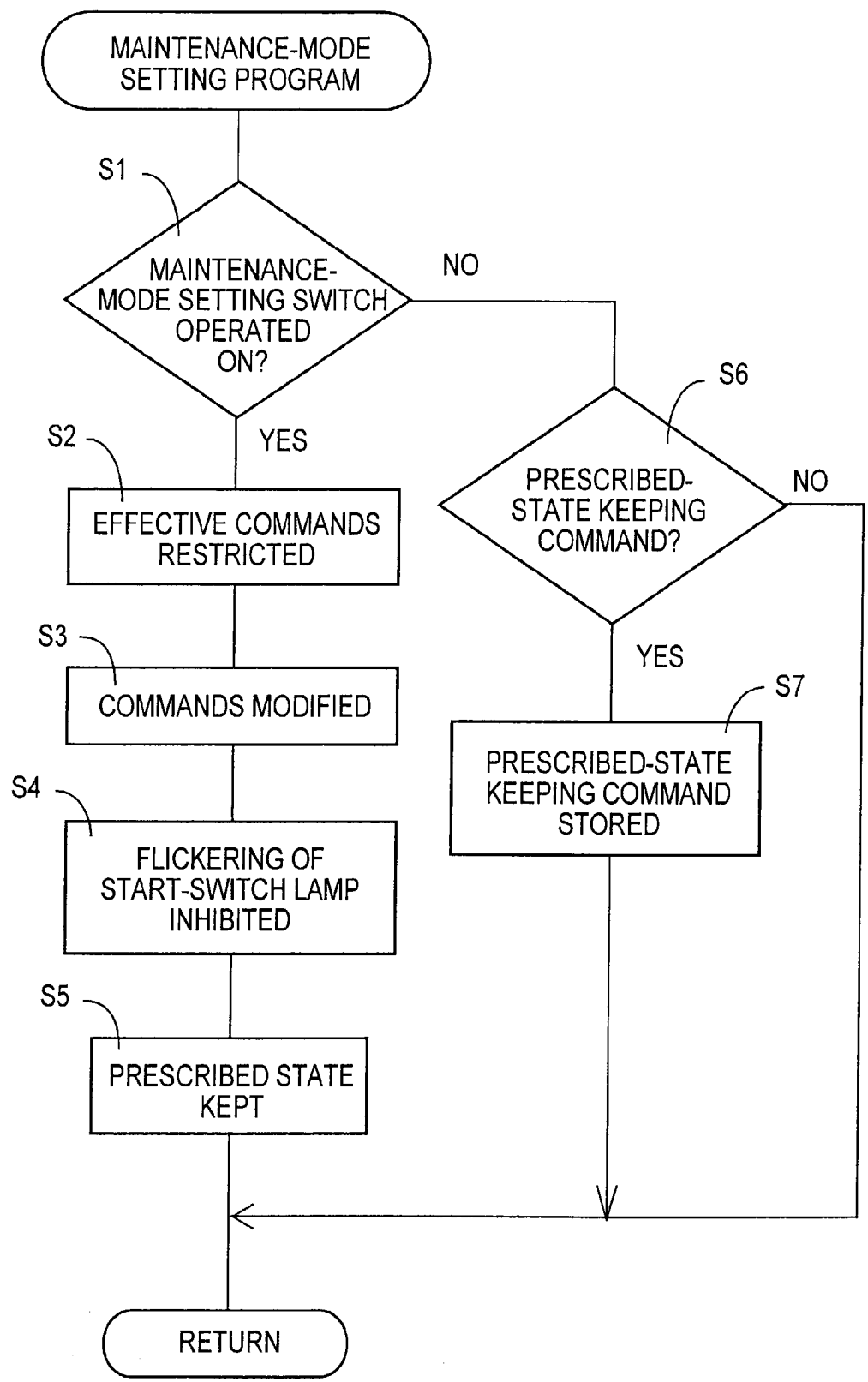
FIG. 9 is a flow chart representing a maintenance-mode setting program that is stored in the control device.

The maintenance mode setting program will be described by reference to the flow chart shown in FIG. 9. First, at Step S1 (hereinafter, "Step" is omitted), the computer 170 judges whether the maintenance-mode setting switch 144 is in the ON state. If a negative judgment is made at S1, the control goes to S6 to judge whether a prescribed-state keeping command has been inputted. If a positive judgment is made at S6, the control goes to S7 to control an operating device designated by the inputted prescribed-state keeping command, such that the operating device is operated to a prescribed state thereof represented by the command. In addition, the computer stores the prescribed-state keeping command. For example, the computer 170 controls the X-Y robot 64 to move and position the component holding heads 60 to and at respective positions above respective component-supply portions of appropriate feeders 52, and controls the elevating and lowering devices 85 to lower the heads 60 toward the component-supply portions and stop the heads 60 at respective positions where the heads 60 do not contact the feeders 52 but are very near to the same. On the other hand, if a negative judgment is made at S6, the computer skips S7.

If a positive judgment is made at S1, the control goes to S2 through S5 where the computer sets the maintenance mode. More specifically described, at S2, the computer restricts commands effective in an automatic-operation mode, such that a total number of the restricted commands effective in the maintenance mode is smaller than that of the commands effective in the automatic-operation mode. S2 is followed by S3 to modify at least a portion of a plurality of normal-state commands effective in a normal state in which the safety covers 122, 14 are opened, into one or more modified commands differing from the normal-state commands. Then, at S4, the computer inhibits flickering of the start-switch lamp 139. Step S4 is followed by S5 to keep the operating device to the above-described prescribed state. S2 through S5 are repeated till the maintenance-mode setting switch 144 is reset to the OFF state. Hereinafter, each of S2 through S5 will be described in more detail, below.

At S2, the commands effective in the automatic-operation mode are restricted by neglecting, e.g., a start command and an automatic-operation remote-control command. The start command is, as shown in FIG. 10, a command to input, when the start switch 138 is operated to the ON state and an electric current is supplied to an electric circuit 210, an electric signal indicating that the start switch 138 is in the ON state, to the I/O port 172. However, a normally closed relay contact 212 and a normally opened relay contact 214 are provided on upstream side of the start switch 138 in a direction in which the electric current flows in the electric circuit 210. The normally opened relay contact 214 is automatically closed when preparations have been done for switching the start switch 138 to the ON state. The normally closed relay contact 212 is interlocked with a switch 216 that is closed and opened when the maintenance-mode setting switch 144 is switched to the ON and OFF states, respectively. Thus, when the maintenance-mode setting switch 144 is switched to the ON state and accordingly the switch 216 is closed, an electric current flows through a relay coil, $R_1$, and the relay contact 212 is opened. Therefore, even if another operator may erroneously operate the start switch 138 while the maintenance of the apparatus is carried out, no electric current flows through the electric circuit 210, so that no electric signal indicating the operation of the start switch 138 is inputted to the I/O port 172. Meanwhile, the automatic-operation remote-control command is a command that is supplied from a remote controller and is to control the X-Y robot 64 to move the component holding heads 60 and/or control the printed-wiring-board conveying device 16 to convey the printed-wiring board 20. Since the remote-control command is neglected, the X-Y robot 64 or the printed-wiring-board conveying device 16 is not operated. Thus, when the operator is doing various operations for the maintenance, in the inner space of the apparatus, the remote controller is reliably prevented from starting an automatic operation of one or more operating devices including the X-Y robot 64.

However, at S2, an inching command and an I/O check command are maintained. The inching command is a command to control the X-Y robot 64 and/or each of the elevating and lowering devices 85 to move a corresponding one of the component holding heads 60 by a prescribed small amount each time an inching-command switch is manually operated by the operator. The I/O check command is a command to check inputting and outputting operations of the I/O port 172.

At S3, e.g., a width changing command to change a width of the printed-wiring-board conveyor 18, and a robot operating command to operate the X-Y robot 64 are modified into respective modified commands to operate the width changing device 34 and the X-Y robot 64 at respective speeds lower than respective speeds at which those devices 34, 64 are operated in a normal state in which the safety covers 122, 124 are closed. Assuming that the respective speeds at which the devices 34, 64 are operated in the normal state are 100%, it is preferred that the respective speeds at which the devices 34, 64 are operated in the maintenance mode range from 20% to 50%. Meanwhile, when the movable guide rail 32 of the printed-wiring-board conveyor 18 is moved according to the width changing command, the moving guide rail 32 may collide with the component holding heads 60. In this case, before the changing of the width is started, the X-Y robot 64 is operated to move the heads 60 to a safe area. Thus, the X-Y robot 64 functions as a change-of-width preparing device.

Figure 11:
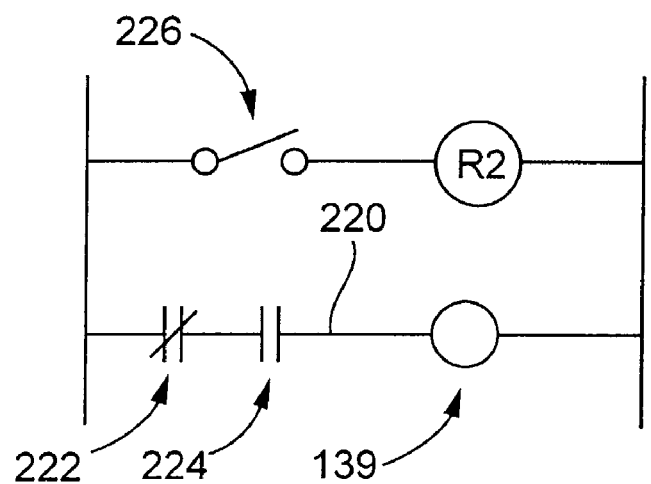
FIG. 11 is a view showing a sequence circuit that is related to a start-switch-lamp-flickering command to flicker a start-switch lamp of the mounting apparatus.

In the present electronic-component mounting apparatus, the start-switch lamp 139 flickers if the condition for starting the apparatus is satisfied. Thus, the operator is informed of the fact that the apparatus can be started by operating the start switch 148. However, in the maintenance mode, the flickering of the start-switch lamp 139 is inhibited at S4. FIG. 11 shows an electric circuit 220 for flickering the start-switch lamp 139. The electric circuit 220 includes a normally closed relay contact 222 and a normally opened relay contact 224. The normally opened relay contact 224 is automatically closed, when preparations have been done for flickering the start-switch lamp 139, so that an electric current flows through the lamp 139 and accordingly the lamp 139 flickers. A switch 226 is closed and opened when the maintenance-mode setting switch 144 is switched to the ON and OFF states, respectively. Thus, when the maintenance-mode setting switch 144 is switched to the ON state and accordingly the switch 226 is closed, an electric current flows through a relay coil, $R_2$, and the normally closed relay contact 222 is opened. If the relay contact 222 is opened, no electric current flows through the lamp 139, even if the normally opened relay contact 224 may be closed. Thus, the lamp 139 does not flicker. Therefore, in the maintenance mode, the operator is prevented from operating the start switch 138.

At S5, the computer keeps, based on the prescribed-state keeping command stored at S7, the operating device operated to the prescribed state at S7 to the same state. For example, the component holding heads 60 are kept to their states in which the heads 60 do not contact the respective component-supply portions of appropriate feeders 52 but are very near to the same. Therefore, in the state in which the safety cover 122, 124 is opened, the operator can insert a body portion thereof into the inner space and check whether respective relative positions between the respective suction nozzles 83 of the heads 60 and the respective component-supply portions of the feeders 52 are correct. Thus, a portion of the RAM 166 of the control device 160 that is used to carry out S5 through S7 provides a prescribed-state keeping device.

In the state in which the present apparatus is in the maintenance mode, the individual devices of the apparatus are supplied with electric power from the power source, though the safety cover 122, 124 is opened. Therefore, the operator can carry out various operations for the maintenance of the apparatus. For example, the motors such as the Y-axis motor 74, the X-axis motor 80 and the Z-axis motors 90 are held in their locked states, and accordingly the respective output members of those motors can be fixedly connected to respective suitable members. Since the Z-axis motors 90 are locked, the component holding heads 60 are prevented from falling down because of their own weights, and accordingly the Z-axis sensors 93 can be adjusted. Moreover, since the illuminating devices 99, 102 are supplied with electric power, those devices 90, 102 can be operated, and accordingly respective focal distances of the CCD camera 98 and the line-scan camera 100 can be adjusted. Since the X-Y robot 64 and the width changing device 34 are operated at respective speeds lower than those in the normal state, the safety of those devices 64, 34 are assured. Since the operation of the start switch 138 is neglected while the operator carries out the maintenance-related operations in the inner space of the present apparatus, the apparatus is prevented from being operated in the automatic-operation mode, even if the start switch 138 is operated.

In the present embodiment, a portion of the control device 160 that controls the operations related to the maintenance of the apparatus, in the ON state of the maintenance-mode setting switch 144, provides a maintenance-related control device. A portion of the control device 160 that carries out S2 provides a command restricting portion and, in particular, a portion of the control device 160 that neglects, at S2, the start command and the remote-control command, provides a command neglecting portion; and a portion of the control device 160 that maintains, at S2, the inching command and the I/O check command, provides a command maintaining portion. A portion of the control device 160 that carries out S3 provides a command modifying portion and, in particular, a portion of the control device 160 that decreases, in the maintenance mode, the speed of operation of at least one operating device in the normal state, provides an operation-speed decreasing portion. A portion of the control device 160 that carries out S4 provides a start-switch-lamp-flickering inhibiting portion.

According to the principle of the present invention, it is not essentially required that the electronic-component mounting apparatus employ all of the command restricting portion, the command modifying portion, the start-switch-lamp-flickering inhibiting portion, and the prescribed-state keeping portion, but it is possible that the mounting apparatus employ at least one of the above-indicated control portions. In addition, it is possible to employ the circuit-bypass dummy 150 and a maintenance-in-limited-area allowing device including the entrance detector 154, in dependent of the above-indicated control portions.

Figure 12:
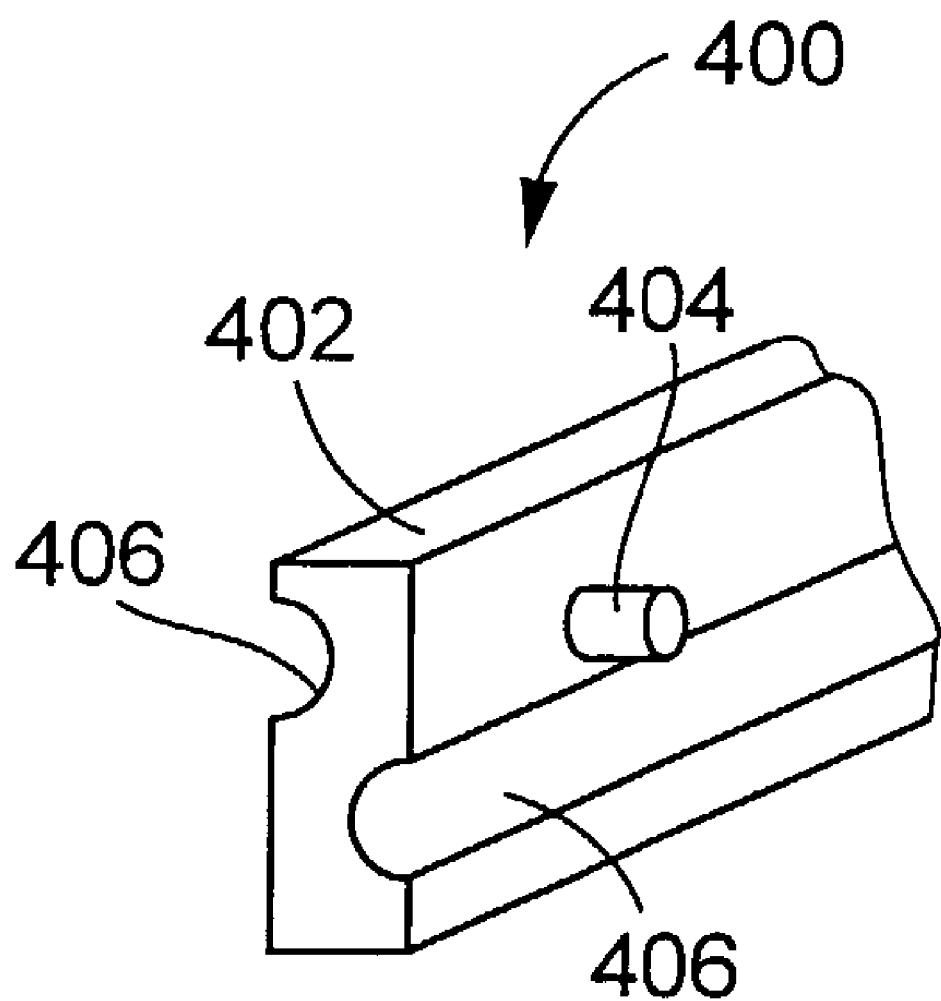
FIG. 12 is a perspective view of a key for use in operating a maintenance-mode setting switch of another electronic-component mounting apparatus as another embodiment of the present invention.

The maintenance-mode setting switch 144 may be modified such that the modified switch is switched to its ON state by turning the key 146 to the maintenance-mode setting position. Alternatively, it is possible to employ a maintenance-mode setting switch that is switched to its ON state by just inserting a key into a keyhole of the switch. In this case, for example, it is possible to employ a key 400 shown in FIG. 12. The key 400 includes a plate-like main portion 402, and an appropriate number of projection 404 and an appropriate number of grooves 406 provided on opposite surfaces of the main portion 402. Thus, if the key 400 is inserted in the keyhole of the maintenance-mode setting switch, the switch is switched to its ON state; and if the key 400 is pulled out of the keyhole, the switch is switched to its OFF state.

Figure 13:
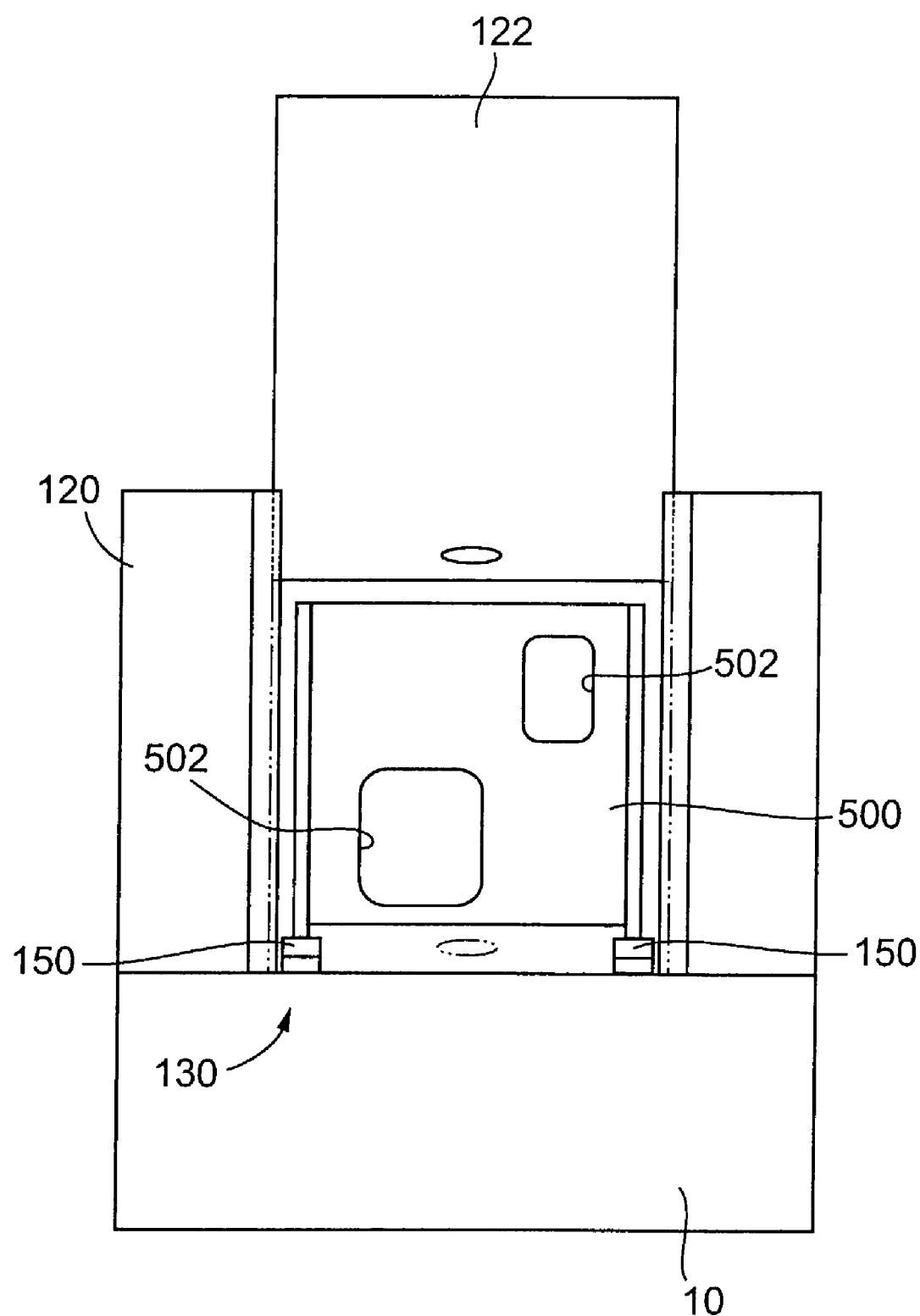
FIG. 13 is a front elevation view of a circuit bypassing dummy and a partial cover of another electronic-component mounting apparatus as another embodiment of the present invention.

The entrance detector 154 as an entrance detecting device that is integral with the circuit-bypass dummy 150, and an in-emergency stopping device including the in-emergency stop switch 140 cooperate with each other to provide an embodiment of the maintenance-in-limited-area allowing device. However, the maintenance-in-limited-area allowing device may be otherwise embodied. For example, the maintenance-in-limited-area allowing device may be provided by a partial cover 500, shown in FIG. 13, that is integral with the circuit-bypass dummy 150. The partial cover 500 is used to cover a space or area created by opening the safety cover 122, and has an insertion hole 502 through which the operator can insert his or her arms into a maintenance-needing space or area. Thus, the operator is allowed to insert his or her arms through the insertion hole 502 so as to carry out the various operations needed for the maintenance of the apparatus, but is not allowed to make access to the dangerous space or area covered by the partial cover 500.

Meanwhile, it is possible to provide, in an upper portion of the electronic-component mounting apparatus (e.g., beneath the upper frame 66), an entrance detecting device that detects that at least a portion of a living person has entered a three-dimensional dangerous space. In this case, the entrance detecting device detects an object that enters the dangerous space, on a non-contact basis, and produces an entrance-detection signal to operate the in-emergency stopping device.

Figure 14:
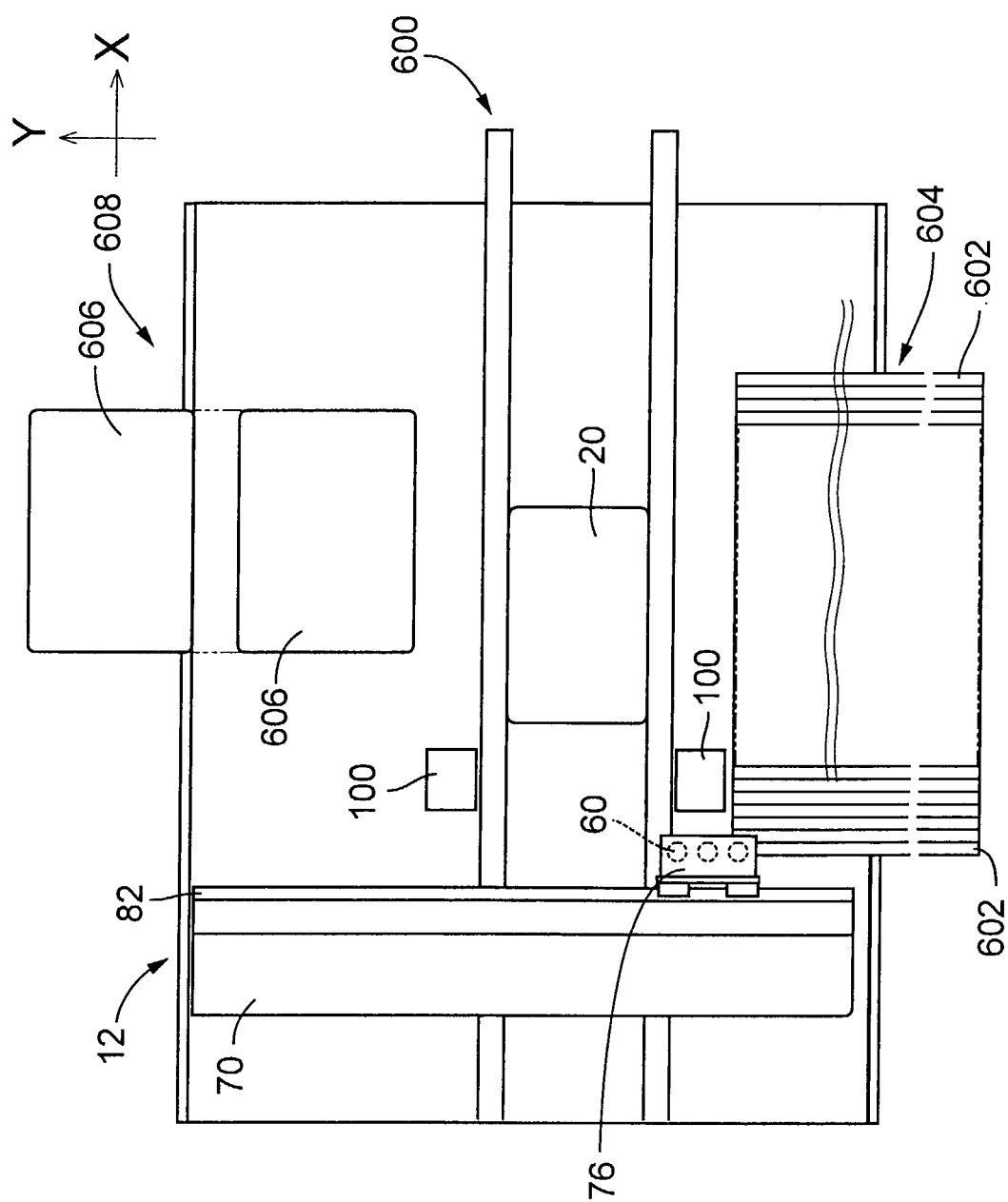
FIG. 14 is a schematic plan view of another electronic-component mounting apparatus as another embodiment of the present invention.

The maintenance-in-limited-area allowing device according to the present invention is applicable to an electronic-component mounting apparatus of a type, shown in FIG. 14, in which a feeder-type electronic-component supplying device 604 including a plurality of electronic-component feeders 602, and a tray-type electronic-component supplying device 608 including a plurality of electronic-component trays 606 are provided on opposite sides of a printed-wiring-board conveying device 600 as a sort of circuit-board conveying device. In FIG. 14, the same reference numerals as used in FIG. 1 are used to designate the corresponding elements of the present apparatus, and the description of those elements are omitted. In the present electronic-component mounting apparatus, the feeder-type and tray-type electronic-component supplying devices 604, 608 substantially function as safety covers that cover an inner space of the mounting apparatus. Various operations related to the maintenance of the present apparatus include one or more operations that require removal of those supplying devices 604, 606, i.e., removal of the safety covers. For example, the adjusting of the line-scan camera 100 as the image taking device requires the removal of those supplying devices 604, 606. In this embodiment, the circuit-bypass dummies 150 are attached to respective portions of the apparatus from which the component supplying devices 604, 608 have been removed, and the entrance detector 154 is used to detect that a body portion of an operator has entered the dangerous space or area. If the entrance detector 154 detects the entrance of the operator's body portion, the control device 160 stops the operation of the apparatus in emergency. Thus, the safety of the apparatus is improved. However, it is possible to employ the partial cover 500 shown in FIG. 13 to prevent the operator's portion from entering the dangerous space or area, or alternatively employ an entrance detecting device that detects entrance of an object into a three-dimensional dangerous space.

Figure 15:
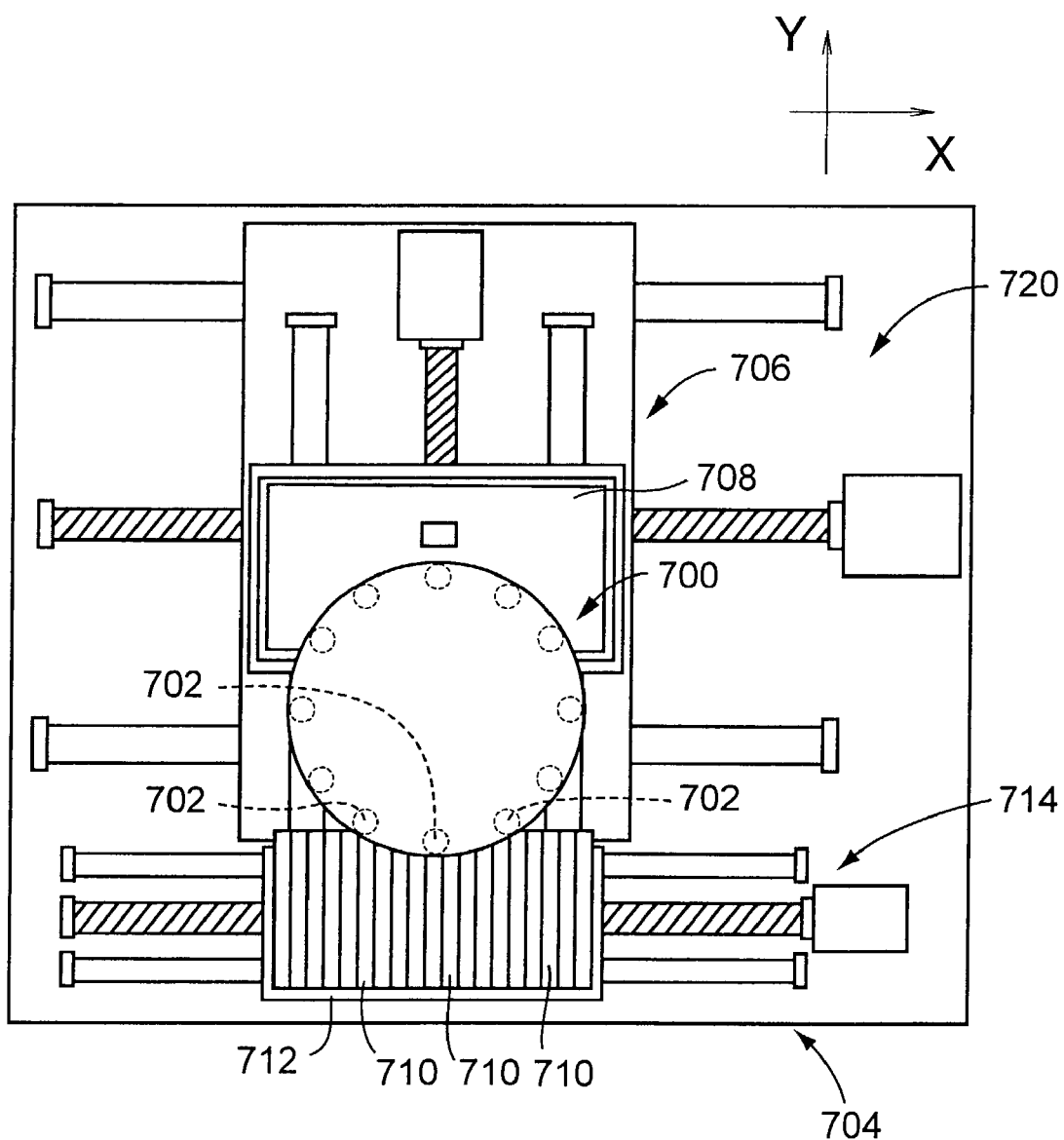
FIG. 15 is a schematic plan view of another electronic-component mounting apparatus as another embodiment of the present invention.

The present invention is applicable to an electronic-component mounting apparatus of a type shown in FIG. 15. The present electronic-component mounting apparatus includes an electronic-component mounting device 700 having a plurality of component holding heads 702 that are revolveable about an axis line (e.g., a vertical axis line); an electronic-component supplying device 704 from which the component holding heads 702 sequentially pick up respective electronic components at a component-pick-up position; and a printed-wiring-board holding device 706 as a circuit-substrate holding device that holds a printed-wiring board 708 as a circuit substrate on which the electronic components are sequentially mounted by the component holding heads 702 at a component-mount position. In the present apparatus, the electronic-component supplying device 704 includes a plurality of electronic-component feeders 710 that are mounted on a feeder-support table 712 such that respective component-supply portions of the feeders 710 are arranged in a certain direction; a table moving device 714 that moves the feeder-support table 712 in that direction (called "D-axis" direction); and a moving device (e.g., an X-Y moving device) 720 that moves, relative to an upper surface of the printed-wring board 708 held by the holding device 706, the electronic-component mounting device 700 to an arbitrary position in a horizontal plane parallel to the upper surface of the board 708. This electronic-component mounting apparatus is disclosed in, e.g., Japanese Patent Document No. 6-342998. In this electronic-component mounting apparatus, the maintenance mode is set in the same manner as that in which the mode is set in the embodiment shown in FIGS. 1 to 11, and accordingly the description of the manner is omitted. Thus, the present apparatus carries out, in the maintenance mode, the restriction of commands, the modification of commands, the inhibition of flickering of the start-switch lamp 139, and the keeping of prescribed state of operating device. In addition, the present apparatus modifies a table-move command to operate the table moving device 714 as an operating device, to a modified table-move command to operate the table moving device 714 to move the feeder-support table 712 at a speed lower than a speed at which the moving device 714 moves the table 712 in a normal state of the apparatus. For example, when the feeder-support table 712 is moved to a position where the table 712 does not interfere with a different device being checked, the table moving device 714 moves the table 712 at the lower speed.

While the present invention has been described in detail in its embodiments, it is to be understood that the present invention is not limited to the details of those embodiments and may be embodied with various changes and improvements, such as those described in SUMMARY OF THE INVENTION, that may occur to a person skilled in the art.

What is claimed is:

1. An apparatus for performing an operation on a circuit substrate, the apparatus comprising:
 a plurality of operating devices which are provided in a space that is closed and opened by a safety cover and one of which performs said operation on the circuit substrate;
 a safety-cover switch which is switchable to an ON state thereof corresponding to a closed state of the safety cover, and to an OFF state thereof corresponding to an opened state of the safety cover;
 a maintenance-related control device which keeps, in a maintenance mode, at least one of said plurality of operating devices to a state thereof in which said at least one operating device is operable; and
 a maintenance-mode setting switch which cooperates with the safety-cover switch to provide a parallel circuit, and which is selectively operable to an ON state thereof in which the maintenance-mode setting switch allows setting of the maintenance mode, and to an OFF state thereof in which the maintenance-mode setting switch does not allow the setting of the maintenance mode.

2. The apparatus according to claim 1, wherein the maintenance-mode setting switch is provided in said space inside the safety cover, and is accessible when the safety cover is in the opened state thereof and is not accessible when the safety cover is in the closed state thereof.

3. The apparatus according to claim 1, wherein the maintenance-mode setting switch comprises a key, and a keyhole in which the key is insertable, and wherein when the key is inserted in the keyhole, subsequently the maintenance-mode setting switch is operated to a maintenance-mode position thereof and additionally the key is pulled out of the keyhole, then the maintenance-mode setting switch is operated to the ON state thereof and allows the setting of the maintenance mode and, when the key is inserted in the keyhole and subsequently the maintenance-mode setting switch is operated to the maintenance-mode position thereof, the maintenance-mode setting switch is kept to the OFF state thereof and does not allow the setting of the maintenance mode.

4. The apparatus according to claim 1, wherein the maintenance-related control device comprises a command restricting portion which restricts, in the maintenance mode, a plurality of commands effective in an automatic-operation mode in which the apparatus is automatically operable, such that a total number of the restricted commands effective in the maintenance mode is smaller than a total number of the commands effective in the automatic-operation mode.

5. The apparatus according to claim 4, wherein the command restricting portion comprises a command neglecting portion which neglects, in the maintenance mode, at least one of a start command to start the apparatus, and a remote-control command to automatically operate at least one of said plurality of operating devices.

6. The apparatus according to claim 4, wherein the command restricting portion comprises a command maintaining portion which maintains at least one of an inching command and an I/O check command, as at least one command effective in the maintenance mode.

7. The apparatus according to claim 1, wherein the maintenance-related control device comprises a command modifying portion which modifies, in the maintenance mode, at least one of a plurality of normal-state commands effective in a normal state in which the safety cover is in the closed state thereof, into at least one modified command differing from said at least one normal-state command.

8. The apparatus according to claim 7, wherein the command modifying portion comprises an operation-speed decreasing portion which operates at least one of said plurality of operating devices such that a speed of operation of said at least one operating device in the maintenance mode is lower than a speed of operation of said at least one operating device in said normal state.

9. The apparatus according to claim 8, wherein said at least one operating device the speed of operation of which is decreased by the operation-speed decreasing portion comprises at least one of (a) a width changing device which changes a width of a circuit-substrate conveyor which conveys the circuit substrate and (b) a width-change preparing device which prepares a change of the width of the circuit-substrate conveyor.

10. The An apparatus according to claim 8, wherein said plurality of operating devices comprises an electric-component supplying device which supplies at least one electric component; a circuit-substrate supporting device which supports the circuit substrate; and an electric-component mounting device which mounts the electric component supplied by the electric-component supplying device, on the circuit substrate supported by the circuit-substrate supporting device, and wherein said at least one operation device the speed of operation of which is decreased by the operation-speed decreasing portion comprises a moving device which moves at least one of the electric-component supplying device and the electric-component mounting device relative to the other of the electric-component supplying device and the electric-component mounting device.

11. The apparatus according to claim 1, wherein the maintenance-related control device comprises a start-switch-lamp-flickering inhibiting portion which inhibits a start-switch lamp from flickering to inform an operator of a state in which a start switch is operable to produce a start command.

12. The apparatus according to claim 1, further comprising a prescribed-state keeping device which stops, when the safety cover is in the closed state thereof, at least one of said plurality of operating devices so that said at least one operating device takes a prescribed state thereof, and keeps said at least one operating device to said prescribed state thereof even when the safety cover is opened.

13. The apparatus according to claim 1, wherein the maintenance-in-limited-area allowing device comprises:
   a detecting device which detects, in the state in which the circuit bypassing member is attached to the apparatus, that a portion of a person has entered the dangerous area; and
   an in-emergency stopping device which stops an operation of the apparatus, in emergency when the detecting device detects that said portion of the person has entered the dangerous area.

14. The apparatus according to claim 1, wherein the maintenance-in-limited-area allowing device comprises a partial cover which allows, in the state in which the circuit bypassing member is attached to the apparatus, a portion of a person to enter the maintenance-needing area and prevents said portion of the person from entering the dangerous area.

15. The apparatus according to claim 1, further comprising:
   a circuit bypassing member which is attached, when the safety cover is in the opened state thereof, to the apparatus so as to establish a same electric state as an electric state when the safety door is in the closed state thereof; and
   a maintenance-in-limited-area allowing device which allows, in a state in which the circuit bypassing member is attached to the apparatus, an access to a maintenance-needing area and does not allow an access to a dangerous area differing from the maintenance-needing area.

* * * * *